(12) United States Patent
Tiwari et al.

(10) Patent No.: US 10,878,897 B2
(45) Date of Patent: Dec. 29, 2020

(54) SYSTEM AND METHOD FOR STORING AND RETRIEVING MULTIBIT DATA IN NON-VOLATILE MEMORY USING CURRENT MULTIPLIERS

(71) Applicant: Silicon Storage Technology, Inc., San Jose, CA (US)

(72) Inventors: Vipin Tiwari, Dublin, CA (US); Hieu Van Tran, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 6 days.

(21) Appl. No.: 16/213,860

(22) Filed: Dec. 7, 2018

(65) Prior Publication Data

US 2019/0206486 A1 Jul. 4, 2019

Related U.S. Application Data

(60) Provisional application No. 62/613,676, filed on Jan. 4, 2018.

(51) Int. Cl.
*G11C 11/56* (2006.01)

(52) U.S. Cl.
CPC .. *G11C 11/5642* (2013.01); *G11C 2211/5641* (2013.01)

(58) Field of Classification Search
CPC .................................................. G11C 11/5642
See application file for complete search history.

(56) References Cited

U.S. PATENT DOCUMENTS

| 4,616,330 A * | 10/1986 | Betz ...................... G06F 7/5443 708/422 |
| 5,029,130 A | 7/1991 | Yeh |
| 5,973,958 A | 10/1999 | Parker |
| 6,032,220 A | 2/2000 | Martin |
| 7,315,056 B2 | 1/2008 | Klinger |
| 7,868,375 B2 | 1/2011 | Liu et al. |
| 9,135,106 B2 | 9/2015 | Weathers |
| 9,269,427 B2 | 2/2016 | Nagey |
| 9,343,148 B2 | 5/2016 | Papandreou et al. |
| 9,589,633 B2 | 3/2017 | Nagey |
| 10,079,067 B1 | 9/2018 | Chen |

(Continued)

FOREIGN PATENT DOCUMENTS

TW 201319930 A1 5/2013

*Primary Examiner* — Jay W. Radke
(74) *Attorney, Agent, or Firm* — DLA Piper LLP (US)

(57) ABSTRACT

A memory device includes memory cells each configured to produce an output current during a read operation. Circuitry is configured to, for each of the memory cells, generate a read value based on the output current of the memory cell. Circuitry is configured to, for each of the memory cells, multiply the read value for the memory cell by a multiplier to generate a multiplied read value, wherein the multiplier for each of the memory cells is different from the multipliers for any others of the memory cells. Circuitry is configured to sum the multiplied read values. The read values can be electrical currents, electrical voltages or numerical values. Alternatively, added constant values can be used instead of multipliers. The multipliers or constants can be applied to read currents from individual cells, or read currents on entire bit lines.

20 Claims, 5 Drawing Sheets

(56) References Cited

U.S. PATENT DOCUMENTS

2012/0051114 A1     3/2012   Lee et al.
2016/0133321 A1*   5/2016   Nagey ................ G11C 13/0028
                                                                         365/148
2017/0220526 A1*   8/2017   Buchanan ............. G06F 7/5443

* cited by examiner

SYSTEM AND METHOD FOR STORING AND RETRIEVING MULTIBIT DATA IN NON-VOLATILE MEMORY USING CURRENT MULTIPLIERS

RELATED APPLICATIONS

This application claims the benefit of U.S. Provisional Application No. 62/613,676, filed Jan. 4, 2018, and which is incorporated herein by reference.

FIELD OF THE INVENTION

The present invention relates to non-volatile memory devices, and more particularly to increasing the number of bits that can be stored therein.

BACKGROUND OF THE INVENTION

Non-volatile memory devices are well known in the art. For example, a split-gate memory cell is disclosed in U.S. Pat. No. 5,029,130. This memory cell has a floating gate and a control gate disposed over and controlling the conductivity of a channel region of the substrate extending between source and drain regions. Various combinations of voltages are applied to the control gate, source and drain to program the memory cell (by injecting electrons onto the floating gate), to erase the memory cell (by removing electrons from the floating gate), and to read the memory cell (by measuring or detecting the conductivity of the channel region to determine the programming state of the floating gate).

The configuration and number of gates in non-volatile memory cells can vary. For example, U.S. Pat. No. 7,315,056 discloses a memory cell that additionally includes a program/erase gate over the source region. U.S. Pat. No. 7,868,375 discloses a memory cell that additionally includes an erase gate over the source region and a coupling gate over the floating gate.

FIG. 1 illustrates a split gate memory cell 10 with spaced apart source and drain regions 14/16 formed in a silicon semiconductor substrate 12. A channel region 18 of the substrate is defined between the source/drain regions 14/16. A floating gate 20 is disposed over and insulated from a first portion of the channel region 18 (and partially over and insulated from the source region 14). A control gate (also referred to as a word line gate or select gate) 22 has a lower portion disposed over and insulated from a second portion of the channel region 18, and an upper portion that extends up and over the floating gate 20 (i.e., the control gate 22 wraps around an upper edge of the floating gate 20).

Memory cell 10 can be erased by placing a high positive voltage on the control gate 22, and a reference potential on the source and drain regions 14/16. The high voltage drop between the floating gate 20 and control gate 22 will cause electrons on the floating gate 20 to tunnel from the floating gate 20, through the intervening insulation, to the control gate 22 by the well-known Fowler-Nordheim tunneling mechanism (leaving the floating gate 20 positively charged—the erased state). Memory cell 10 can be programmed by applying a ground potential to drain region 16, a positive voltage on source region 14, and a positive voltage on the control gate 22. Electrons will then flow from the drain region 16 toward the source region 14, with some electrons becoming accelerated and heated whereby they are injected onto the floating gate 20 by hot-electron injection (leaving the floating gate negatively charged—the programmed state). Memory cell 10 can be read by placing ground potential on the drain region 16, a positive voltage on the source region 14 and a positive voltage on the control gate 22 (turning on the channel region portion under the control gate 22). If the floating gate is positively charged (erased), the memory cell will be turned on, and electrical current will flow from source region 14 to drain region 16 (i.e. the memory cell 10 is sensed to be in its erased "1" state based on sensed current flow). If the floating gate 20 is negatively charged (programmed), the channel region under the floating gate is weakly turned on at best or turned off, thereby reducing or preventing any current flow (i.e., the memory cell 10 is sensed to be in its programmed "0" state based on sensed low or no current flow).

FIG. 2 illustrates an alternate split gate memory cell 30 with the same elements as memory cell 10, but additionally with a program/erase (PE) gate 32 disposed over and insulated from the source region 14 (i.e. this is a three gate design). Memory cell 30 can be erased by placing a high positive voltage on the PE gate 32 to induce tunneling of electrons from the floating gate 20 to the PE gate 32. Memory cell 30 can be programmed by placing positive voltages on the control gate 22, PE gate 32 and source region 14, and a current on drain region 16, to inject electrons from the current flowing through the channel region 18 onto floating gate 20. Memory cell 30 can be read by placing positive voltages on the control gate 22 and drain region 16, and sensing current flow.

FIG. 3 illustrates an alternate split gate memory cell 40 with the same elements as memory cell 10, but additionally with an erase gate 42 disposed over and insulated from the source region 14, and a coupling gate 44 over and insulated from the floating gate 20. Memory cell 40 can be erased by placing a high positive voltage on the erase gate 42 and optionally a negative voltage on the coupling gate 44 to induce tunneling of electrons from the floating gate 20 to the erase gate 42. Memory cell 40 can be programmed by placing positive voltages on the control gate 22, erase gate 42, coupling gate 44 and source region 14, and a current on drain region 16, to inject electrons from the current flowing through the channel region 18 onto floating gate 20. Memory cell 30 can be read by placing positive voltages on the control gate 22 and drain region 16 (and optionally on the erase gate 42 and/or the coupling gate 44), and sensing current flow.

For all the above referenced memory cells, voltages are applied in each of the program, erase and read operations to program the memory cells to a "0" state, erase the memory cells to a "1" state, and to read the memory cells to determine whether they are in the programmed state or the erased state. One drawback to such memory devices is that each memory cell can only store one bit of data (i.e., two bit values) because the memory cell has only two possible states. The above described memory devices are not compatible for use with applications which need to store additional bit values such as analog bit values in a continuous range of values instead of just two binary bit values.

BRIEF SUMMARY OF THE INVENTION

The aforementioned problems and needs are addressed by a memory device that includes memory cells each configured to produce an output current during a read operation, circuitry configured to, for each of the memory cells, generate a read value based on the output current of the memory cell, circuitry configured to, for each of the memory cells, multiply the read value for the memory cell by a multiplier to generate a multiplied read value, wherein the multiplier for each of the memory cells is different from the multipliers for any others of the memory cells, and circuitry configured to sum the multiplied read values.

The memory device can include memory cells each configured to produce an output current during a read operation, circuitry configured to, for each of the memory cells, generate a read value based on the output current of the memory cell, circuitry configured to, for each of the memory cells, add a constant value to the read value to generate an added read value, wherein the constant for each of the memory cells is different from the constants for any others of the memory cells, and circuitry configured to sum the added read values.

The memory device can also include a plurality of memory cells arranged in rows and columns, wherein each of the memory cells is configured to produce an output current during a read operation, a plurality of bit lines each connected to one of the columns of the memory cells for receiving the output currents from the one column of the memory cells, circuitry configured to, for each of the bit lines, generate a read value based on the received output currents by the bit line, circuitry configured to, for each of the bit lines, multiply the read value for the bit line by a multiplier to generate a multiplied read value, wherein the multiplier for each of the bit lines is different from the multipliers for any others of the bit lines, and circuitry configured to sum the multiplied read values.

The memory device can also include a plurality of memory cells arranged in rows and columns, wherein each of the memory cells is configured to produce an output current during a read operation, a plurality of bit lines each connected to one of the columns of the memory cells for receiving the output currents from the one column of the memory cells, circuitry configured to, for each of the bit lines, generate a read value based on the received output currents by the bit line, circuitry configured to, for each of the bit lines, add a constant value to the read value for the bit line to generate an added read value, wherein the constant for each of the bit lines is different from the constants for any others of the bit lines, and circuitry configured to sum the added read values.

Other objects and features of the present invention will become apparent by a review of the specification, claims and appended figures.

DETAILED DESCRIPTION OF THE INVENTION

Figure 1:
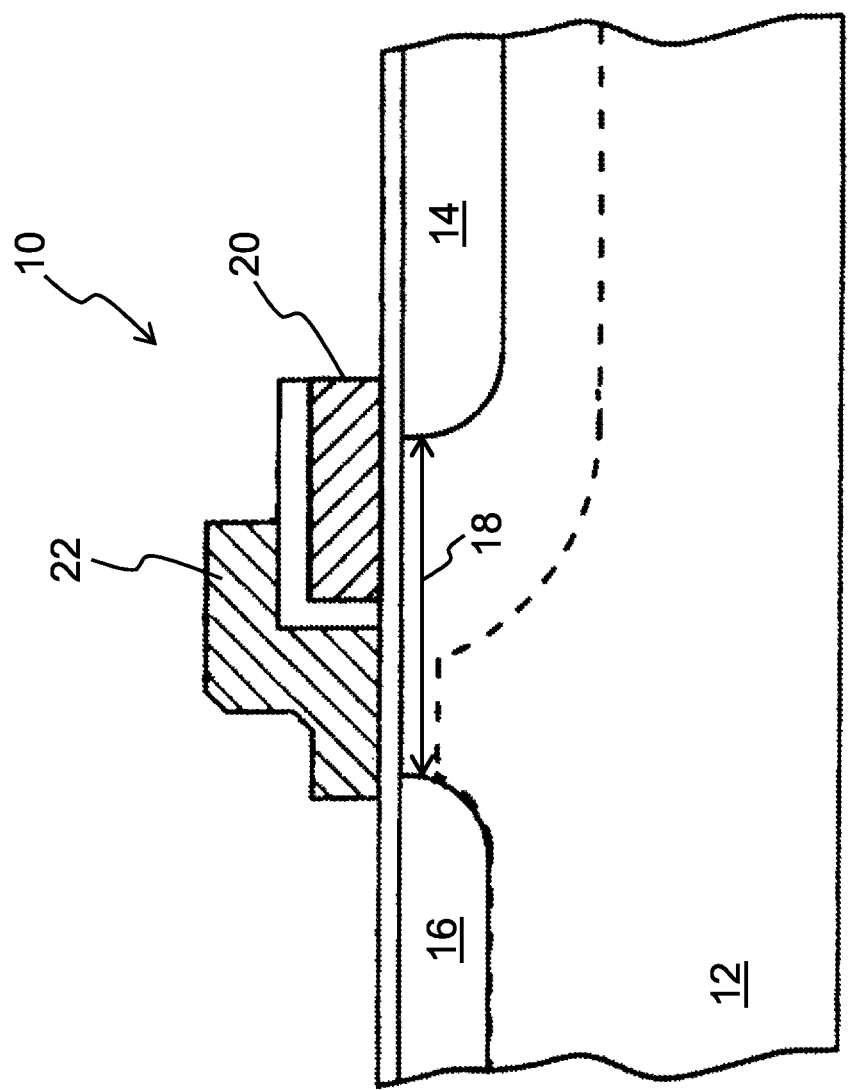
FIG. 1 is a side cross sectional view of a first conventional split gate non-volatile memory cell.
Figure 2:
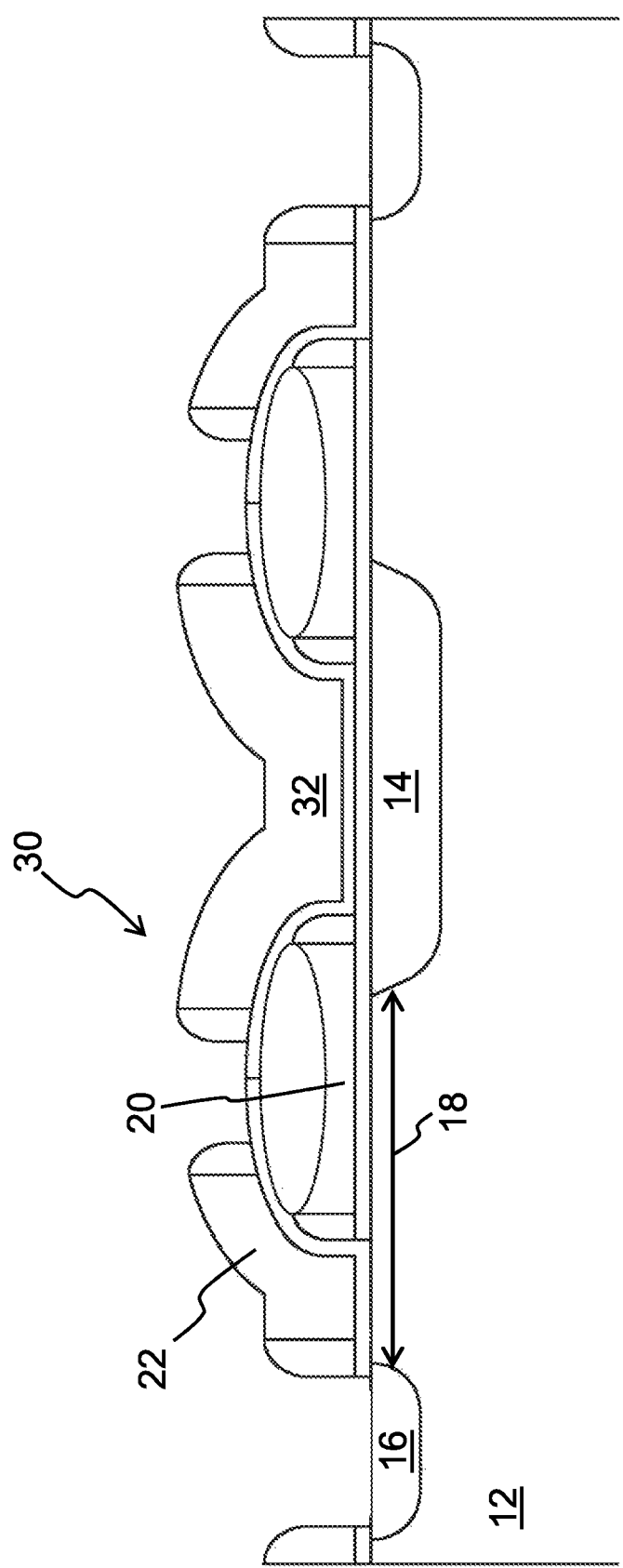
FIG. 2 is a side cross sectional view of a second conventional split gate non-volatile memory cell.
Figure 3:
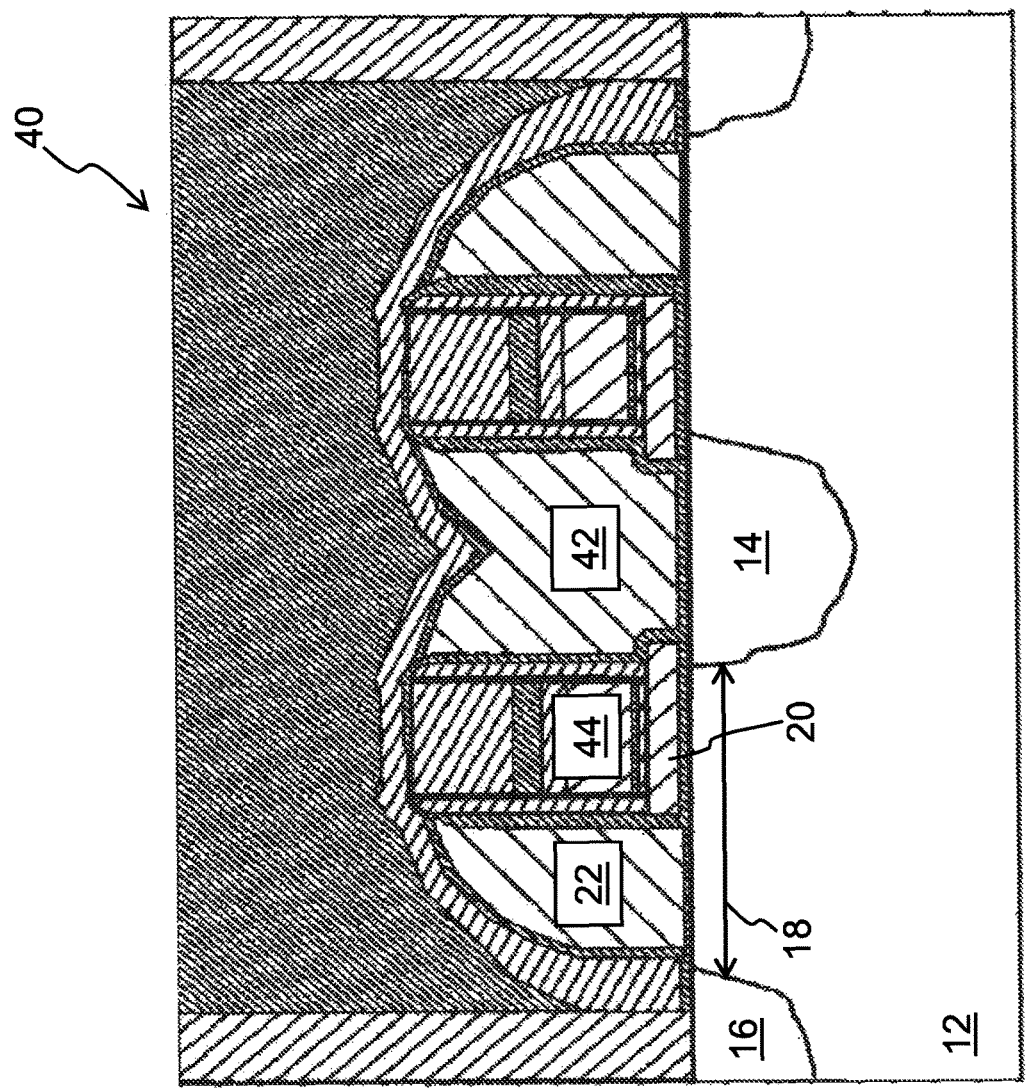
FIG. 3 is a side cross sectional view of a third conventional split gate non-volatile memory cell.
Figure 4:
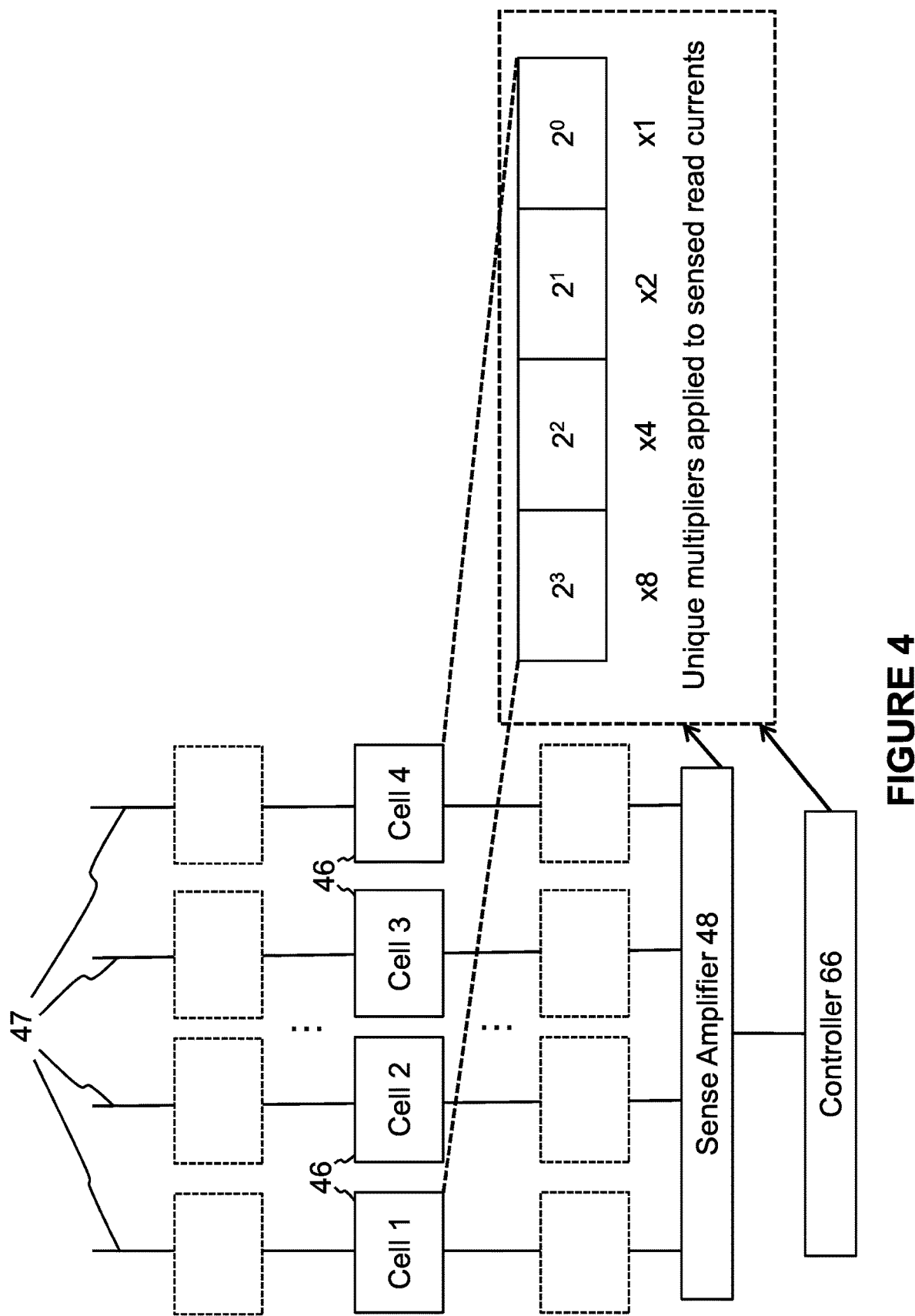
FIG. 4 is a diagram illustrating the unique multiplier values used to multiply against the read current of four memory cells used to store a bit value.

The present invention is directed to non-volatile memory devices capable of storing analog bit values in memory cells. This is accomplished by storing analog bit values using multiple memory cells for each bit value. The technique is illustrated in FIG. 4, using a grouping of four memory cells 46 as an example. However, the number and locations of memory cells used to store each bit value can vary. Memory cells 46 can be any of the memory cells described above with respect to FIGS. 1-3. The memory cells 46 are preferably arranged in an array of rows and columns, with bit lines 47 connected to the drain regions 16 and to a sense amplifier 48. Preferably, each column of memory cells includes a bit line 47 that connects to the drain regions 16 of all the memory cells 46 in the column, and to the sense amplifier 48. The sense amplifier 48, among other things, amplifies, detects and measures (senses) the read current (i.e., output current) from the memory cells on the bit lines 47 during a read operation. Each memory cell 46 can be individually read by disabling all the other memory cells on the same bit line 47 during the read operation, and detecting the output current from the one memory cell during the read operation.

In the present example, four memory cells 46 in same row but different columns are used to illustrate the present invention. However, any combination of memory cells 46 in terms of numbers, and relative position, can be used. Each analog bit value is represented by a unique combination of digital binary bits and thereby "digital program states" for the four memory cells 46. What is unique with this technique is how the information is read out from the memory cells 46. During a read operation, the read current for each memory cell 46 is sensed by the sense amplifier 48. Memory cells 46 programmed with electrons will have a very low or no read current. Memory cells 46 in the erased stated will have a higher read current. Each cell's read current is multiplied by a unique multiplier value (i.e. performed outside of the actual array of memory cells, for example in the periphery of the memory block such as by the sense amplifier 48 and/or controller 66), so that the sum of the currents for the group of memory cells 46 for any given combination of program states will produce a unique sum value for each set of word line inputs applied to the group of memory cells.

FIG. 4 illustrates an exemplary, non-limiting example of the unique multiplier values for the four-cell example. In FIG. 4, the most significant bit is stored in the first memory cell 46 (cell 1), the next significant bit is stored in the second memory cell 46 (cell 2), and so on, with the least significant bit stored in the fourth memory cell 46 (cell 4). During a read operation, the cell currents are sensed on the bit lines 47 using the sense amplifier 48. Those cell currents are each multiplied by a unique multiplier value (i.e., no multiplier value is the same for any of the four cells). In the present example, the sequence of multiplier values, starting with cell 4 and ending with cell 1 is set forth by the equation $2^X$, where X are non-negative integers (e.g., 0, 1, 2, 3) for cells 4, 3, 2, 1 respectively. This means that the read current of cell 4 is multiplied by 1, the read current of cell 3 is multiplied by 2, the read current of cell 2 is multiplied by 4, and the read current of cell 1 is multiplied by 8. The four read currents, after the multiplication, are then summed to provide a final summed read current for the 4 memory cells. The final summed read current will have a unique value for each of the possible combinations of program states for all the memory cells (i.e. those possible combinations of program states being 0000, 0001, 0010, 0100, 1000, 0011, . . . 1111). In this manner, the peripheral circuitry (e.g., controller 66) can read out the summed read current and determine the unique analog bit, even though it is stored using multiple digital binary cells each capable of having the same read current as other cells.

While the example of FIG. 4 uses the formula $2^X$ to determine the progression of the unique multiplier values, any other formula or technique that produces unique multiplier values for all the memory cells storing the analog bit can be used. For example, the progression 1K, 2K, 3K, 4K could be used for multiplying the read currents for any constant value of K (i.e., the multipliers follow the equation of X·K, where X are positive integers and K is a constant value). Alternately, instead of multiplying multipliers against the read currents, unique addition constants could be added to the cell currents (i.e., where a unique constant value is added to each cell current). For example, the following addition formula can be used: $R_1+A$, $R_2+B$, $R_3+C$, $R_4+D$, where R is the read current from one of the memory cells 46 and A-D are unique constant values (different from each other) added to the read currents. Multipliers and the addition constants can be integers, whole numbers, fractions or even negative numbers or values.

The multipliers or addition constants can be applied directly or indirectly to the cell read currents, either before, during or after additional signal processing. For example, the multipliers or addition constants can be applied to the sensed cell read currents before or as part of the sensing of the read cell currents (e.g., by the sense amplifier 48). Alternately, the multipliers or addition constants can be applied to the sensed cell read current values by the sense amplifier 48 or the controller 66 after the cell read currents are initially sensed by the sense amplifier 48. For any given cell current, the amplitude of that current can be increased as dictated by the corresponding multiplier or addition constant before, during or after initial sensing by the sense amplifier. Alternatively, the cell current can be converted to a voltage, and the amplitude of that voltage can be increased as dictated by the corresponding multiplier or addition constant. Or, a numerical value can be directly or indirectly determined from the cell current, whereby the numerical value is maintained or changed by the corresponding multiplier or addition constant. Therefore, generally speaking, it is a read value that is subjected to the multiplier or addition constant, where the read value is a voltage, a current or a numerical value that is generated based on the cell current during a read operation.

For some applications, more than one memory cell on the same bit line can be read at the same time (i.e., multiple memory cells on the same bit line are contributing to the read current being sensed on the bit line). For example, in analog neural networks applications, where the memory cells are used to store weights that are multiplied against incoming signals placed on their word lines, multiple rows of memory cells are simultaneously read. In such a case, the read current on any given bit line will be a sum of all the read currents from the memory cells being read on that bit line. Therefore, when multiple rows of memory cells are being simultaneously read, the unique multipliers or addition constants are being applied (directly or indirectly) to the bit line read currents (each of which includes read current contributions from multiple memory cells on the bit line).

Figure 5:
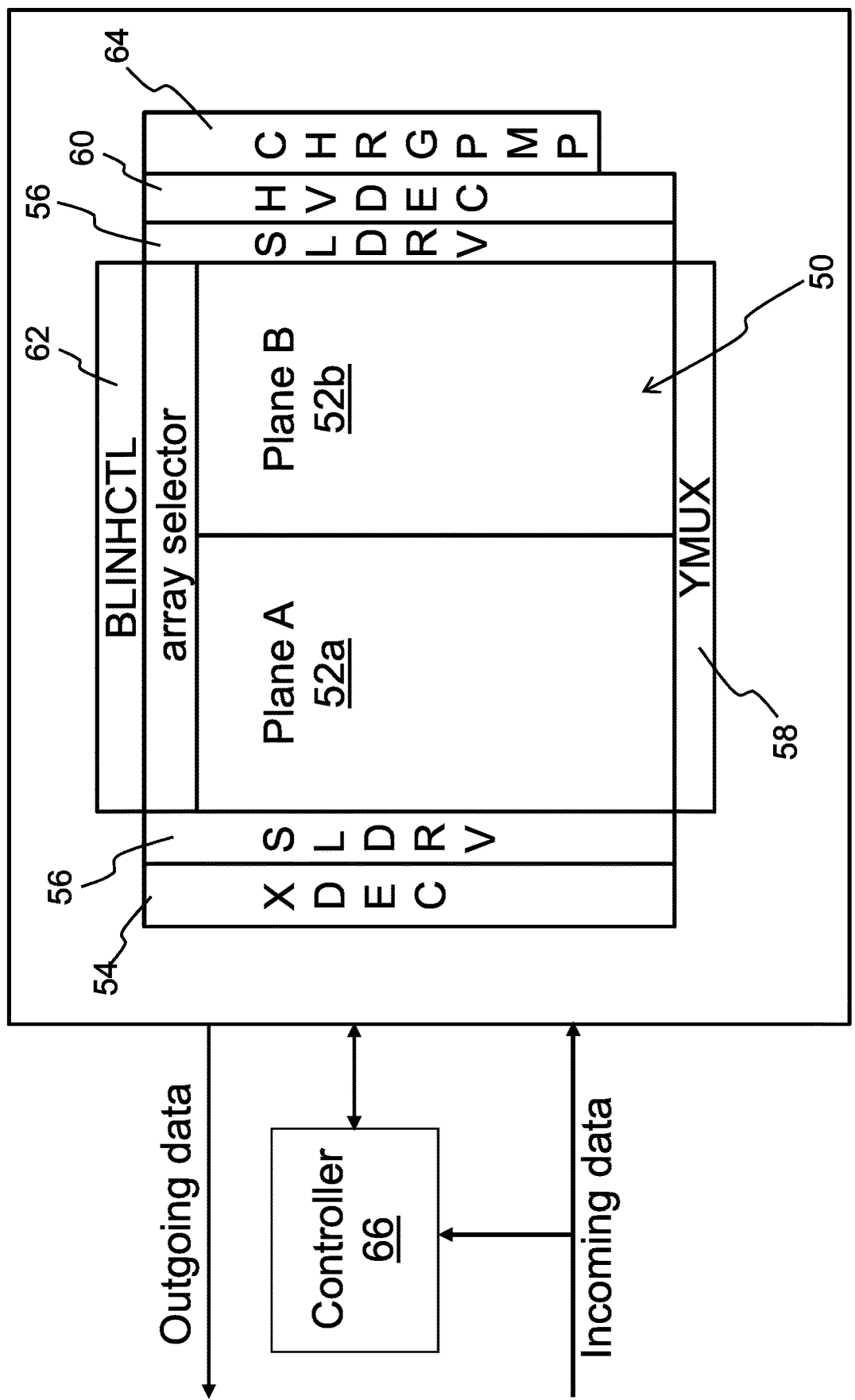
FIG. 5 is a plan view of a memory device architecture.

The architecture of an exemplary memory device is illustrated in FIG. 5. The memory device includes an array 50 of the non-volatile memory cells 46, which can be segregated into two separate planes (Plane A 52a and Plane B 52b). The memory cells 46 can be of the type shown in FIGS. 1-3, formed on a single chip, arranged in a plurality of rows and columns in the semiconductor substrate 12. Adjacent to the array of non-volatile memory cells are address decoders (e.g. XDEC 54 (row decoder), SLDRV 56, YMUX 58 (column decoder), HVDEC 60) and a bit line controller (BLINHCTL 62), which are used to decode addresses and supply the various voltages to the various memory cell gates and regions during read, program, and erase operations for selected memory cells. Column decoder 58 includes the sense amplifier 48 containing circuitry for measuring the currents on the bit lines 47 during a read operation. Controller 66 (containing control circuitry) controls the various device elements to implement each operation (program, erase, read) on target memory cells. Charge pump CHRGPMP 64 provides the various voltages used to read, program and erase the memory cells under the control of the controller 66. As discussed above, the read current multipliers or addition constants can be implemented, for example, with circuitry in the controller 66. Alternately or additionally, the read current multipliers or addition constants can be implemented with circuitry in the sense amplifier 48 portion of the column decoder YMUX 58.

While the above embodiment is described with respect to the binary programmed and erased states of the memory cells 46 whereby the read operation is performed with read voltages that exceed the threshold voltage for turning erased memory cells 46 fully on, the read operation of the memory cells 46 could be performed using sub-threshold voltages, meaning that the memory cell 46 is never fully turned on during a read operation even if in a fully erased state. Instead, the memory cells are operated in a sub-threshold manner where there is a detectable difference in read current through the memory cell based upon the program state of the memory cell but without turning the memory cell fully on. This is advantageous for applications such as analog neural networks, in which the memory cells are used to store weights that are multiplied against incoming signals placed on their word lines. Each cell is operated in the sub-threshold mode so that input signals can be effectively multiplied with the weight values stored in the set of cells. In that case, the final summed read current (after the multipliers or addition constants are applied to the set of memory cells used to store the weight value) will have a unique value for each of the possible combinations of program states and inputs applied (e.g. coming from an audio, video or image input and pre-processed before arriving on the word-line inputs of the memory array).

While the above described embodiment is illustrated in the context of four memory cells used to store the analog bit value, fewer or greater numbers of memory cells can be used. Moreover, the combination of cells used to store each analog bit value need not be in the same row or even adjacent to each other, but could be any combination of the memory cells anywhere in the array.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, not all method steps need be performed in the exact order illustrated or eventually claimed. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/ elements there between, as well as forming the element indirectly on the substrate with one or more intermediate materials/elements there between.

What is claimed is:

1. A memory device, comprising:
   memory cells each configured to produce an output current during a read operation;
   circuitry configured to, for each of the memory cells, generate a read value based on the output current of the memory cell;
   circuitry configured to, for each of the memory cells, multiply the read value for the memory cell by a multiplier to generate a multiplied read value, wherein the multiplier for each of the memory cells is different from the multipliers for any others of the memory cells, and wherein the multipliers follow a progression; and
   circuitry configured to sum the multiplied read values.

2. The memory device of claim 1, wherein the circuitry configured to generate the read values is configured to generate the read values by amplifying the output currents of the memory cells, and wherein the read values are electrical currents.

3. The memory device of claim 1, wherein the circuitry configured to generate the read values is configured to generate the read values by generating voltages based on the output currents of the memory cells, and wherein the read values are voltages.

4. The memory device of claim 1, wherein the circuitry configured to generate the read values is configured to generate the read values by generating numerical values based on the output currents of the memory cells.

5. The memory device of claim 1, wherein the multipliers follow the progression according to 2X, where X are non-negative integers.

6. The memory device of claim 1, wherein the multipliers follow the progression according to X·K, where X are positive integers and K is a constant value.

7. A memory device, comprising:
   memory cells each configured to produce an output current during a read operation;
   circuitry configured to, for each of the memory cells, generate a read value based on the output current of the memory cell;
   circuitry configured to, for each of the memory cells, add a constant value to the read value to generate an added read value, wherein the constant value for each of the memory cells is different from the constant values for any others of the memory cells; and
   circuitry configured to sum the added read values.

8. The memory device of claim 7, wherein the circuitry configured to generate the read values is configured to generate the read values by amplifying the output currents of the memory cells, and wherein the read values are electrical currents.

9. The memory device of claim 7, wherein the circuitry configured to generate the read values is configured to generate the read values by generating voltages based on the output currents of the memory cells, and wherein the read values are voltages.

10. The memory device of claim 7, wherein the circuitry configured to generate the read values is configured to generate the read values by generating numerical values based on the output currents of the memory cells.

11. A memory device, comprising:
    a plurality of memory cells arranged in rows and columns, wherein each of the memory cells is configured to produce an output current during a read operation;
    a plurality of bit lines, wherein each of the bit lines is connected to a respective one of the columns of the memory cells for receiving the output currents from the respective one column of the memory cells;
    circuitry configured to, for each of the bit lines, generate a read value based on the received output currents by the bit line;
    circuitry configured to, for each of the bit lines, multiply the read value for the bit line by a multiplier to generate a multiplied read value, wherein the multiplier for each of the bit lines is different from the multipliers for any others of the bit lines, and wherein the multipliers follow a progression; and
    circuitry configured to sum the multiplied read values.

12. The memory device of claim 11, wherein the circuitry configured to generate the read values is configured to generate the read values by amplifying the output currents of the bit lines, and wherein the read values are electrical currents.

13. The memory device of claim 11, wherein the circuitry configured to generate the read values is configured to generate the read values by generating voltages based on the output currents of the bit lines, and wherein the read values are voltages.

14. The memory device of claim 11, wherein the circuitry configured to generate the read values is configured to generate the read values by generating numerical values based on the output currents of the bit lines.

15. The memory device of claim 11, wherein the multipliers follow the progression according to 2X, where X are non-negative integers.

16. The memory device of claim 11, wherein the multipliers follow the progression according to X·K, where X are positive integers and K is a constant value.

17. A memory device, comprising:
    a plurality of memory cells arranged in rows and columns, wherein each of the memory cells is configured to produce an output current during a read operation;
    a plurality of bit lines, wherein each of the bit lines is connected to a respective one of the columns of the memory cells for receiving the output currents from the respective one column of the memory cells;
    circuitry configured to, for each of the bit lines, generate a read value based on the received output currents by the bit line;
    circuitry configured to, for each of the bit lines, add a constant value to the read value for the bit line to generate an added read value, wherein the constant value for each of the bit lines is different from the constant values for any others of the bit lines; and
    circuitry configured to sum the added read values.

18. The memory device of claim 17, wherein the circuitry configured to generate the read values is configured to generate the read values by amplifying the output currents of the bit lines, and wherein the read values are electrical currents.

19. The memory device of claim 17, wherein the circuitry configured to generate the read values is configured to generate the read values by generating voltages based on the output currents of the bit lines, and wherein the read values are voltages.

20. The memory device of claim 17, wherein the circuitry configured to generate the read values is configured to generate the read values by generating numerical values based on the output currents of the bit lines.

* * * * *